United States Patent
Boehlke (10) Patent No.: US 9,454,968 B2
(45) Date of Patent: Sep. 27, 2016

(54) DIGITAL AUDIO TRANSMITTER AND RECEIVER

(71) Applicant: SUMMIT SEMICONDUCTOR LLC, Hillsboro, OR (US)

(72) Inventor: Kenneth A. Boehlke, Portland, OR (US)

(73) Assignee: Summit Semiconductor LLC, Beaverton, OR (US)

( * ) Notice: Subject to any disclaimer, the term of this patent is extended or adjusted under 35 U.S.C. 154(b) by 132 days.

(21) Appl. No.: 14/185,681

(22) Filed: Feb. 20, 2014

(65) Prior Publication Data
US 2015/0100325 A1    Apr. 9, 2015

Related U.S. Application Data (63) Continuation of application No. 14/050,082, filed on Oct. 9, 2013, now Pat. No. 9,183,838.

(51) Int. Cl.
| | | |
|---|---|---|
| *G10L 19/005* | (2013.01) | |
| *H03M 13/09* | (2006.01) | |
| *H03M 13/27* | (2006.01) | |
| *H04L 1/00* | (2006.01) | |

(52) U.S. Cl.
CPC .......... *G10L 19/005* (2013.01); *H03M 13/096* (2013.01); *H03M 13/2792* (2013.01); *H04L 1/00* (2013.01); *H03M 13/27* (2013.01)

(58) Field of Classification Search
CPC ........... H04H 20/30; H04H 2201/186; H04H 20/28; H04H 2201/20; H04L 1/0071; H04L 1/0041; H04L 27/2647; H03M 13/09; H03M 13/1515; H03M 13/096; H03M 13/2792; G10L 19/005; H04R 2205/024; H04R 2420/07; H04S 7/30
USPC ...................................................... 714/776
See application file for complete search history.

(56) References Cited

U.S. PATENT DOCUMENTS

| | | | | |
|---|---|---|---|---|
| 5,056,112 A | * | 10/1991 | Wei ...................... | H04L 1/0057 375/267 |
| 5,386,478 A | | 1/1995 | Plunkett | |
| 5,465,396 A | * | 11/1995 | Hunsinger ............. | H04H 20/30 375/232 |
| 5,534,933 A | * | 7/1996 | Yang ..................... | H04H 20/28 329/357 |
| 5,666,424 A | | 9/1997 | Fosgate et al. | |
| 5,987,320 A | * | 11/1999 | Bobick ................. | H04W 24/00 370/241 |
| 6,081,700 A | * | 6/2000 | Salvi ....................... | H04B 1/18 455/193.3 |
| 6,157,330 A | * | 12/2000 | Bruekers ............... | G06T 1/0021 341/143 |
| 6,523,147 B1 | * | 2/2003 | Kroeger ................ | H03M 13/25 714/790 |
| 7,123,731 B2 | | 10/2006 | Cohen et al. | |
| 7,155,017 B2 | | 12/2006 | Kim et al. | |
| 7,158,643 B2 | | 1/2007 | Lavoie et al. | |
| 7,234,095 B2 | * | 6/2007 | Lee ....................... | H03M 13/09 714/751 |
| 7,272,073 B2 | | 9/2007 | Pellegrini et al. | |
| 7,319,641 B2 | | 1/2008 | Goudie et al. | |
| 7,496,004 B2 | * | 2/2009 | Sako ...................... | G11B 20/10 369/4 |
| 7,505,825 B2 | * | 3/2009 | Wilson .............. | G11B 20/10527 381/119 |
| 7,676,044 B2 | | 3/2010 | Sasaki et al. | |

(Continued)

FOREIGN PATENT DOCUMENTS

WO    2006131893 A1    12/2006

*Primary Examiner* — James C Kerveros
(74) *Attorney, Agent, or Firm* — Chernoff, Vilhauer, McClung & Stenzel, LLP (57) ABSTRACT

A method is shown for increasing the fidelity of digitally encoded audio, by an interleaving the signal step, frequency conversion step, and polynomial interpolation step along with comparison to a second, redundant signal.

8 Claims, 7 Drawing Sheets

(56) References Cited

U.S. PATENT DOCUMENTS

| | | | | |
|---|---|---|---|---|
| 7,873,120 B2* | 1/2011 | Kroeger | ............... | H04B 1/406 375/265 |
| 8,199,941 B2 | 6/2012 | Hudson et al. | | |
| 2004/0240573 A1* | 12/2004 | Yuasa | ................. | H04B 1/0003 375/260 |
| 2004/0266473 A1* | 12/2004 | Tsunehara | ............ | H04W 52/08 455/522 |
| 2005/0251725 A1* | 11/2005 | Huang | .............. | H03M 13/2789 714/752 |
| 2005/0251726 A1* | 11/2005 | Takamura | ......... | H03M 13/2707 714/755 |
| 2007/0133813 A1 | 6/2007 | Morishima | | |
| 2011/0107176 A1* | 5/2011 | Song | ................ | H03M 13/1515 714/755 |
| 2014/0314177 A1* | 10/2014 | Choi | .................... | H04B 7/0413 375/296 |

* cited by examiner

| 48kHz Audio Rate, Radio Link at 18 Mbps ||||
|---|---|---|---|
| Attn | RX power level | Old Method | New Interpolator Method |
| 67 | -71 | 142 | 142 |
| 68 | -72 | 142 | 142 |
| 69 | -73 | 142 | 142 |
| 70 | -74 | 142 | 142 |
| 71 | -75 | 142 | 142 |
| 72 | -76 | 100 | 142 |
| 73 | -77 | 88 | 142 |
| 74 | -78 | 55 | 120 |
| 75 | -79 | 33 | 100 |
| 76 | -80 | 10 | 75 |
| 77 | -81 | 0 | 10 |
| 78 | -82 | 0 | 0 |
| 79 | -83 | 0 | 0 |

| 96kHz Audio Rate, Radio Link at 36 Mbps | | | |
|---|---|---|---|
| Attn | RX power level | Old Method | New Interpolator Method |
| 63 | -67 | 145 | 145 |
| 64 | -68 | 145 | 145 |
| 65 | -69 | 145 | 145 |
| 66 | -70 | 120 | 145 |
| 67 | -71 | 99 | 145 |
| 68 | -72 | 63 | 145 |
| 69 | -73 | 50 | 145 |
| 70 | -74 | 45 | 145 |
| 71 | -75 | 40 | 130 |
| 72 | -76 | 35 | 110 |
| 73 | -77 | 20 | 85 |
| 74 | -78 | 15 | 50 |
| 75 | -79 | 0 | 10 |

FIG. 9

DIGITAL AUDIO TRANSMITTER AND RECEIVER

RELATED APPLICATION(S)

This application is a continuation in part of U.S. application Ser. No. 14/050,082 now U.S. Pat. No. 9,183,838.

BACKGROUND OF THE INVENTION

Digital audio signals may be composed of a succession of 24-bit samples at a rate of 48 kSa/s. A complete multi-channel audio sample comprises one sample for each channel. Thus, in the case of an eight channel home theater audio system, one multi-channel sample comprises eight 24-bit samples.

A radio transmitter may transmit a digital audio data wirelessly to radio receivers incorporated in the speakers. The digital audio signals is supplied to a packetizer, which constructs a transmission packet having a payload that contains the digital audio data for several, e.g. 48, multi-channel audio samples. In the case of the eight channel system, the transmission packet may contain the data for six multi-channel samples.

The radio transmitter employs the transmission packet data bits to modulate a carrier at the frequency of a selected communication channel and transmits the modulated signal via an antenna. In each speaker, a radio receiver receives the modulated signal and detects the modulating transmission packet data bits. An audio processor included in the speaker recovers the digital audio signal assigned to that speaker from the successive transmission packets, converts the digital audio signal to analog form, amplifies the analog audio signal and supplies the audio signal to the audio driver.

It is possible for one or more packets to be lost or damaged in transmission from the AVR to a speaker. This leaves a gap in the sound information and degrades the quality of the reproduction of the audio signal. It is possible to reduce the degradation through various signal processing techniques such as interleaving packets and interpolating between lost or damaged data points.

Advances in microelectronic capacity permit wireless transport of many sources of high fidelity 24 bit uncompressed audio data. This data must be transmitted with no loss in accuracy to satisfy audiophile tastes. By interleaving samples at the transmitter, and de-interleaving and polynomial interpolation at the receiver, short duration errors can be fixed. There is needed an additional improvement to correct long duration errors, including data outages.

SUMMARY

A signal to be transmitted is input. The elements are interleaved to minimize the impact of data loss. Secondary information is sent along with the primary uncompressed audio. This secondary information is at a lower bit depth (SNR scaled) and at decimated sampling rate.

The combine data stream (uncompressed plus compressed audio) is sent from the transmitter to the receive, or through several repeaters to the receiver. After transmission and reception, the signal is examined for missing or damaged elements, determined if folding is required, and such elements are estimated using an interpolation process.

The foregoing and other objectives, features, and advantages of the invention will be more readily understood upon consideration of the following detailed description of the invention taken in conjunction with the accompanying drawings.

DETAILED DESCRIPTION OF PREFERRED EMBODIMENTS

It is possible to minimize errors and maximize the quality of sound transmitted through a noisy and/or lossy channel through the use of certain processing techniques. Interleaving a digital signal spreads out a loss over several packets so that it is diluted by good data. A checksum process detects missing or damaged data, making it possible to fill it in by interpolation. "Folding" a signal makes interpolation more accurate for high frequencies by reversibly converting them to lower frequencies, which are easier to interpolate.

Interleaving a primary signal consists of breaking down packets into their constituent parts and recombining them into new packets comprising parts from each of the packets to be interleaved. In audio transmission, interleaving four packets has been found to provide a good balance between minimizing losses and minimizing processing time. The actual interleaving algorithm may take many forms, but one common and effective form is to divide each packet into the same number of sections as there are packets to be interleaved, then create a new set of interleaved packets, each with one section from each of the old packets.

In one embodiment, using block interleaving, the first new packet may be constructed out of the first section of each old packet, the second new packet may be made from the second section of each old packet, and so on. The process may be represented symbolically, as shown:

$$1_1 1_2 1_3 1_4 \; 2_1 2_2 2_3 2_4 \; 3_1 3_2 3_3 3_4 \; 4_1 4_2 4_3 4_4 \cdots \gg 1_1 2_1 3_1 4_1$$
$$1_2 2_2 3_2 4_2 \; 1_3 2_3 3_3 4_3 \; 1_4 2_4 3_4 4_4.$$

In another embodiment, using recursive interleaving, the process would be represented symbolically at the symbol level as:

$$S_n S_{n+1} S_{n+2} S_{n+3} \; S_{n+k} S_{n+1+k} S_{n+2+k} S_{n+3+k} \cdots \gg$$
$$S_n S_{n+1-k} S_{n+2-2k} S_{n+3-3k} \; S_{n+k} S_{n+1} S_{n+2-k} S_{n+3-2k}$$

Where k=packet length=4, and S=samples. This corresponds to a representation on the packet level as:

$$1_1 1_2 1_3 1_4 \; 2_1 2_2 2_3 2_4 \; 3_1 3_2 3_3 3_4 \; 4_1 4_2 4_3 4_4 \; 5_1 5_2 5_3 5_4$$
$$6_1 6_2 6_3 6_4 \; 7_1 7_2 7_3 7_4 \cdots \gg 4_1 3_2 2_3 1_4 \; 5_1 4_2 3_3 2_4$$
$$6_1 5_2 4_3 3_4 \; 7_1 6_2 5_3 4_4$$

Interpolation is most effective when performed on DC or low-frequency signals, where large swings between data points do not occur. For sufficiently high frequencies, interpolation is highly unreliable and may not be better than simply omitting a data point. For signal in this range, it is necessary to reversibly convert the signal to a low frequency one to permit accurate interpolation. When interleaving is combined with frequency conversion and polynomial interpolation, high fidelities at reasonable processing speeds are possible. The interleaved packets are then transmitted.

Secondary information is sent along with the primary uncompressed audio. This secondary information is at a lower bit depth (SNR scaled) and at decimated sampling rate. It may include codec operations, such as spatial combining or mu-law or a-law compression. The secondary information may be interleaved like the primary uncompressed audio, but usually over a larger time window. Because the redundant, secondary information is processed using a codec, it uses a much lower data rate than the uncompressed audio and so can be added to the uncompressed bit stream with little overhead.

The combine data stream (uncompressed plus compressed audio) is sent from the transmitter to the receiver, or through several repeaters to the receiver. In this transmission, data is lost. The amount of data lost and lost data duration increases with each radio repetition.

When the interleaved packets are received, the reverse process is performed to de-interleave them. The de-interleaved packets will correspond to the original transmitted packets, assuming no transmission errors. In this way, if an interleaved packet is lost or damaged in transmission, rather than losing all data in one transmission packet, each de-interleaved packet loses only a portion of the data it would normally contain. Thus the damage to accurate sound reproduction is spread out over a longer time period than would otherwise be the case and becomes less noticeable.

Sound quality can be improved still further if it is possible to replace the missing or damaged section of the de-interleaved packet when it is detected. Lost or damaged data can be detected using a checksum process. "Checksum" as used in this application should be construed to encompass error detection regimes that rely on a mathematical manipulation of the data to produce a single datum (in the form of a bit, byte, or word) which can be transmitted along with the data for comparison on the receiving end after the same manipulation is performed. Other possible systems to detect missing or damaged data include, but are not limited to, longitudinal parity checks, Fletcher's checksum, Adler-32, cyclic redundancy checks (CRC), and MD5, all of which are well known in the art of data transmission and error correction.

Figure 2:
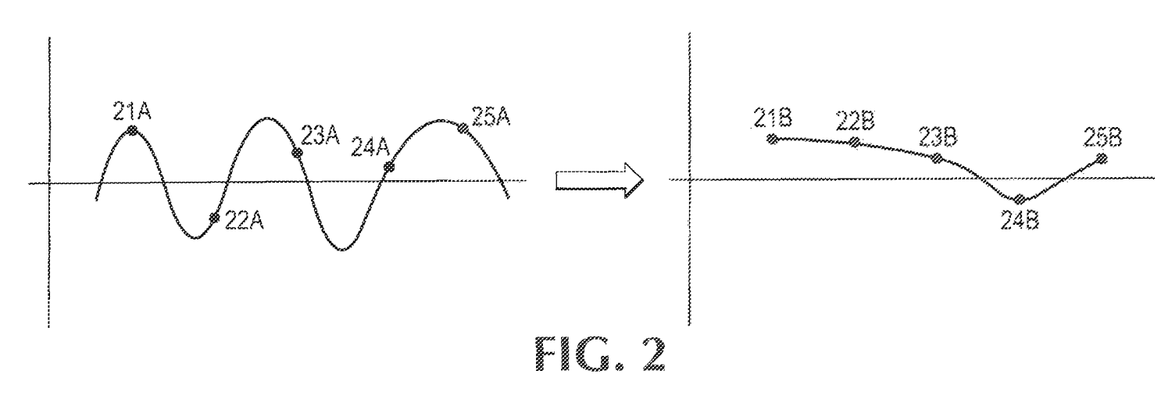
FIG. 2 shows the effect of frequency folding on a high-frequency signal.

When the checksum fails and the missing or damaged interleaved packet is identified, the missing or damaged section of each de-interleaved packet can also be identified. Referring to FIG. 2, the checksum process may reveal that the packet $1_2 2_2 3_2 4_2$ is missing or damaged. Thus, the de-interleaved packets may be represented symbolically as shown in FIG. 2 where 24B indicates a missing or damaged section. Then interpolation techniques can be used to estimate the data that the missing or damaged section formerly contained. Polynomial interpolation is an effective and comparatively simply form of interpolation. Given N points, an Nth order polynomial can be fit to the points. The location of the missing or damaged point can then be found on the resulting curve and its value made estimated.

Interpolation of any kind is most effective on curves which change only slightly between points, or in the world of audio, temporal representations of low frequencies. At one extreme, a DC signal requires no interpolation at all. At another extreme, a high-frequency signal might have data points that literally alternate between maxima and minima of the signal, leaving the interpolator with little hope of finding an accurate value using a curve fit. For this reason, "folding" the frequency spectrum at a point where interpolation is still successful is desirable.

Figure 1:
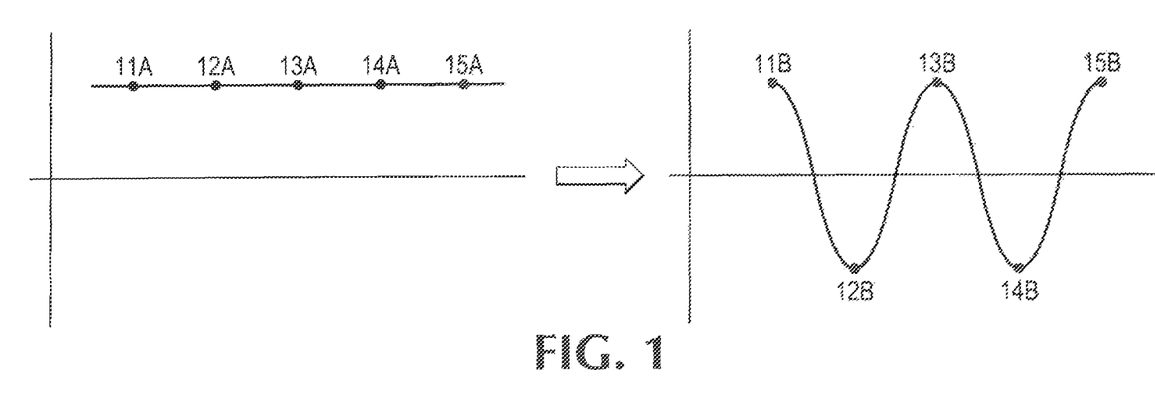
FIG. 1 shows the effect of frequency folding on a DC signal.

This "folding" is accomplished by multiplying the sequence of data points in the signal by the binary sequence that is most closely correlated to the signal. A DC signal will be converted to a high-frequency signal swinging strongly between extremes, as FIG. 1 shows. Points 11A, 13A, and 15A are untouched and become 11B, 13B, and 15B. Points 12A and 14A are converted to 12B and 14B, resulting in a strongly oscillating signal. A high frequency signal such as that shown in FIG. 2 will tend towards becoming a DC signal, as Points 21A, 13A, and 15A retain their original values (show as 21B, 23B, and 25B) while points 22A and 24A are inverted to become 22B and 24B. Note that the high frequency signal will not actually become a DC signal unless the signal is at the same frequency as the samples, but it will nonetheless be altered in to a signal which is more easily and accurately interpolated. In this way, the difficulty of proper interpolation for high frequencies is lowered or eliminated. Once the missing or damaged points have been interpolated, the signal may be "unfolded" by subjecting it to the same process as when it was folded, effectively restoring the original signal with accurately interpolated points in place of gaps in the data.

"Folding" low frequencies will make them harder to interpolate. Therefore, the optimal interpolation will be achieved when only high frequencies are folded and low frequencies are not. Digital audio signals are normally time-domain signals, with the frequencies undifferentiated, and therefore it is impossible to fold only certain frequencies. Instead, the entire signal must be folded. For this reason, the decision to fold or not fold must be made on an ongoing basis, depending on the predominant frequencies in the signal. This decision to fold or not fold can is optimally made relatively frequently, after no more than 100 samples have gone by since the last decision, for a signal having about 48,000 samples per second. The decision is therefore made approximately every 0.002 seconds.

Figure 3:
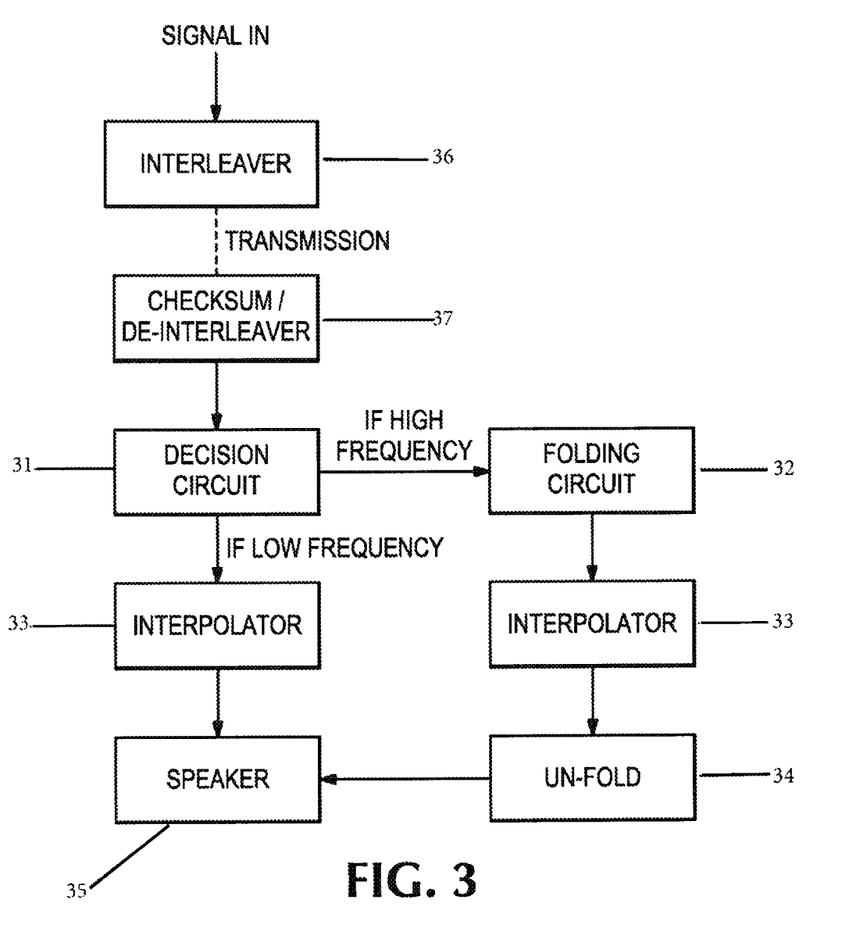
FIG. 3 is a block diagram showing a transmitter and a receiver for a digital audio signal.

Preferably, the signal is examined by the decision-making circuit before it is passed into the rest of the circuit for reproduction. If high frequencies predominate in a given interval, that interval will be folded before interleaving and transmission. If low frequencies predominate, then it will not be folded. Experimentation has shown that interpolation is very successful up to approximately 10 kHz and degrades in quality after that point. Therefore, in a preferred embodiment, "low" frequencies are below 10 kHz and "high" frequencies are above it. As shown in FIG. 3, a decision circuit 31 will cause a folding circuit 32 to be applied to a high-frequency signal before the high-frequency signal is interpolated by an interpolator 33. This necessitates that an unfold circuit 34 should be applied to the high-frequency signal, before the high-frequency signal is sent to a speaker 35. In contrast, the decision circuit 31 will not cause a folding circuit 32 to be applied to a low-frequency signal, and, as a collary, it will not be necessary for an unfolding circuit 34 to be applied. Rather, the low-frequency signal will be interpolated by an interpolator 33 and then sent to a speaker 35. As suggested previously, prior the decision circuit 31 acting on a signal, it may be preferable to interleave the signal with an interleaver 36, and have the signal verified in checksum process 37.

Figure 6:
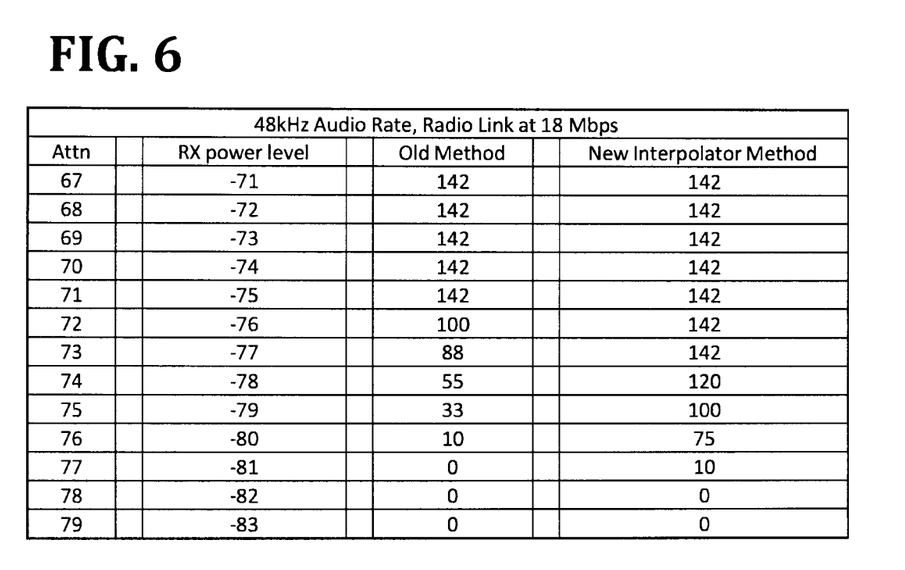
FIG. 6 is a table showing signal fidelity test results at 48 kHz with a radio link of 18 Mbps.

In one embodiment, the interpolator showed dramatic improvement in fidelity when tested at 48 kHz with a radio link of 18 Mbps. The results of this test are shown at FIG. 6. Under the older, known methods, signal fidelity began to deteriorate at −76 dBm and suffered step degradation thereafter and decreasing power levels. In contrast, the new interpolator maintained much higher signal fidelity though decreasing power levels, as shown below.

Figure 7:
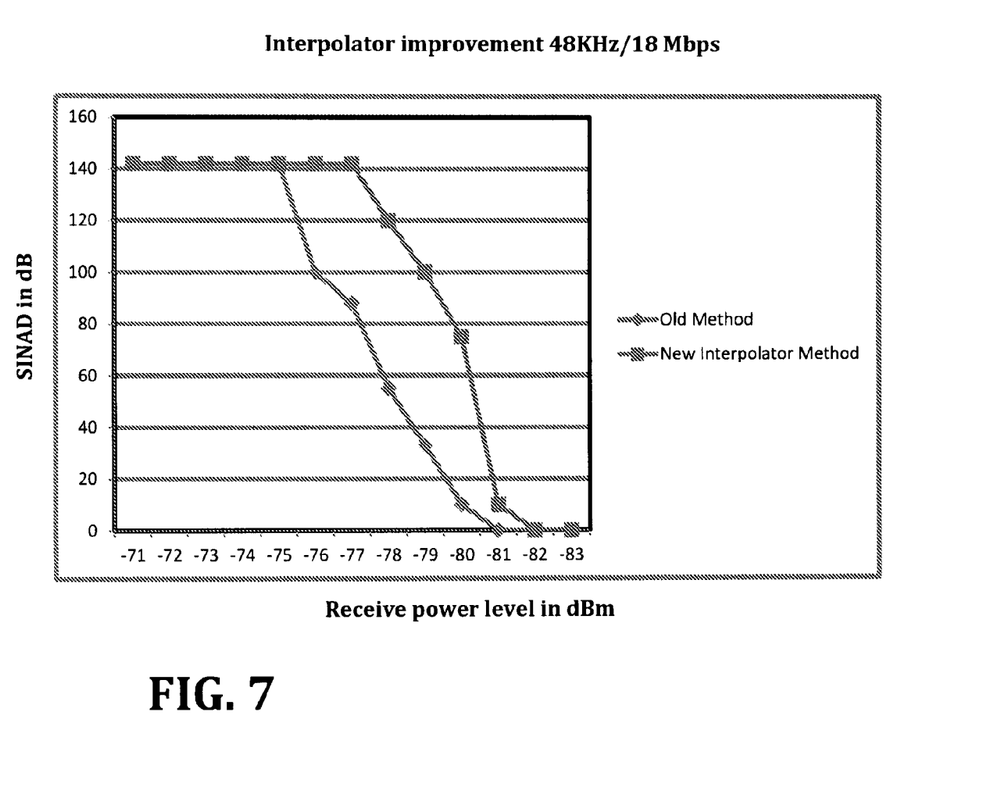
FIG. 7 is graphic illustration of the FIG. 6 data.

The rapid degradation using the older method is also shown in FIG. 7.

At an output power of −77 dBm, the signal-to-noise and distortion ratio (SINAD) improves from approximately 90 dB to 140 dB. At −80 dBm, the SINAD improves from approximately 10 dB to 80 dB. This improvement is a 300-1000 times increase in power over known methods.

Figure 8:
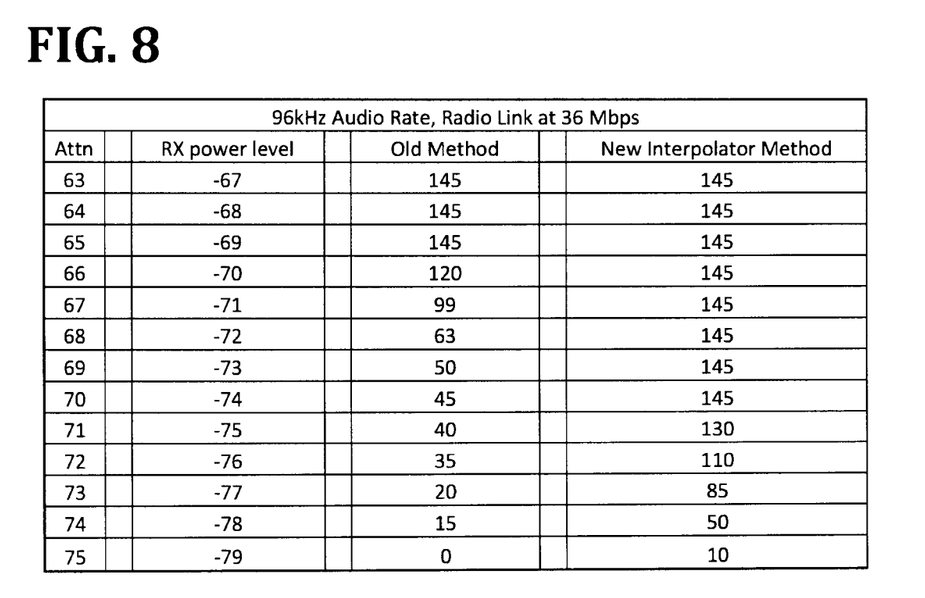
FIG. 8 is a table showing signal fidelity test results at 96 kHz with a radio link of 36 Mbps.

In another embodiment the interpolater showed dramatic improvement in fidelity when tested at 96 kHz with a radio link of 36 Mbps. The results of this test are shown at FIG. 8. Under the older, known methods, signal fidelity began to deteriorate at −70 dBm and suffered step degradation thereafter and decreasing power levels. In contrast, the new interpolator maintained much higher signal fidelity though decreasing power levels, as shown below.

Figure 9:
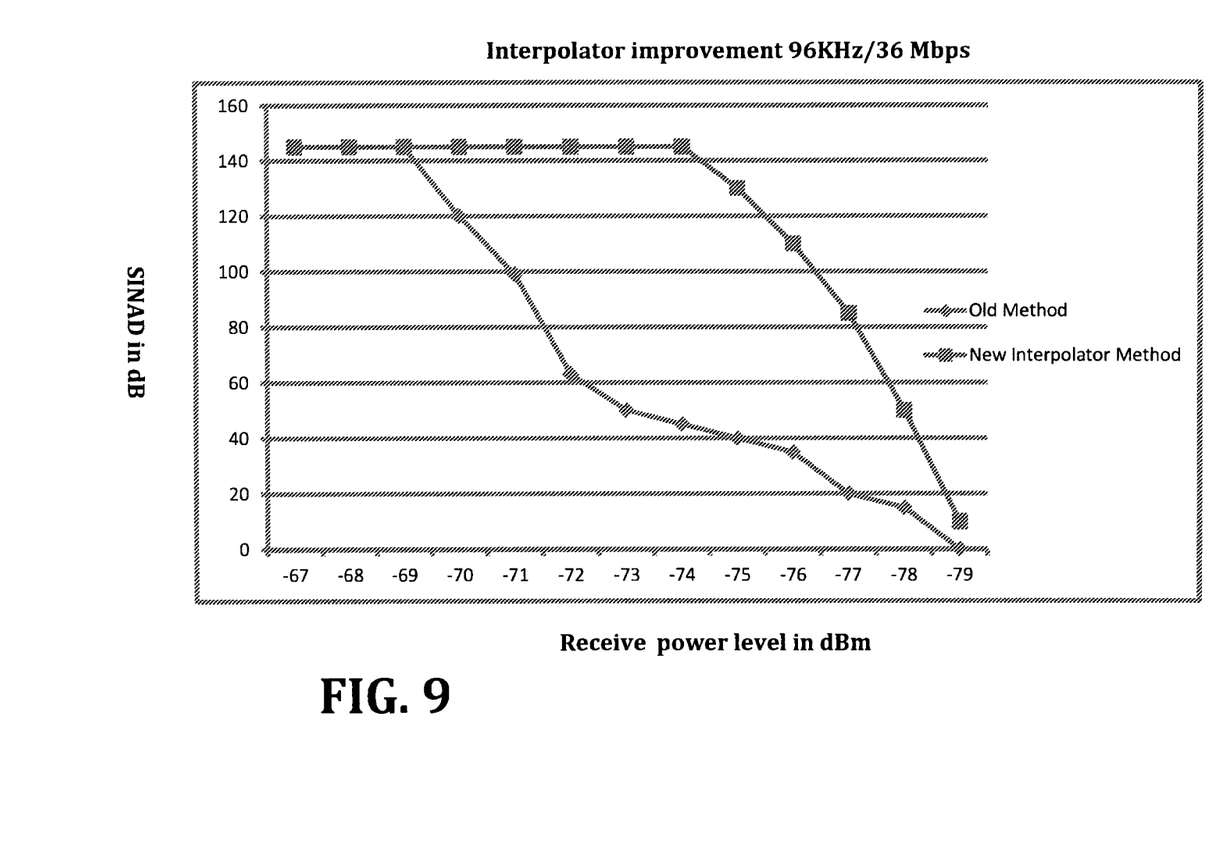
FIG. 9 is a graphic illustration of the FIG. 7 data.

The rapid degradation using the older method is also shown in FIG. 9.

The improvement in SINAD here is even more dramatic. At −75 dBm, the SINAD improves from approximately 40 dB under known methods to approximately 130 dB.

In one embodiment, the received data is reassembled into audio samples. If the uncompressed audio sample was recovered, any redundant audio sample is discarded. If the uncompressed audio sample was not recovered, any redundant audio sample is recovered. It is also possible that neither the uncompressed or redundant audio sample was recovered.

From these scenarios, the final output samples are assembled. All uncompressed audio samples are copied to the output. From the uncompressed samples, any redundant audio sample values are interpolated and the value of redundant sample is compared to its interpolated sample value. If the interpolated sample value is within the error tolerance of the redundant sample, it is copied to the output; otherwise the redundant sample is used. Finally, the remaining unrecovered samples are interpolated from the copied uncompressed, interpolated, or redundant samples.

In another embodiment, the system had two data streams: one at full bit resolution and a redundant one at reduced resolution. The SNR reduced redundant one uses a fraction of the throughput as the full bit stream. This SNR reduced stream, because of its small size, can be transmitted with more error coding and/or with a lower modulation rate making it much more robust than full bit resolution path, so that in marginal link conditions, the SNR redundant stream is always available and the quality of the system is improved through minimizing data dropouts.

Figure 4:
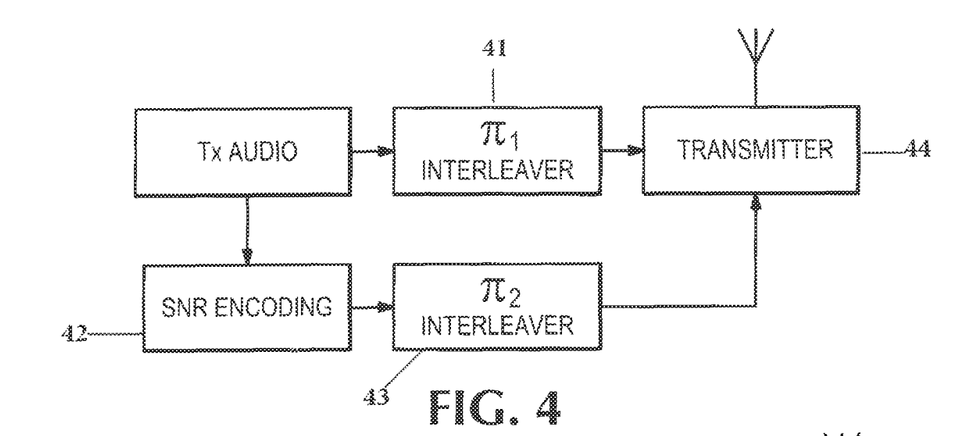
FIG. 4 is a block diagram of the steps preparing a signal for transmission.

FIG. 4 illustrates one approach to this embodiment. As shown, audio signal Tx enters interleaver 41 and emerges as interleaved signal $\pi 1$. Audio signal Tx additionally undergoes signal-to-noise ("SNR") encoding 42 and a second interleaver 43 to emerge as signal $\pi 2$. Signals $\pi 1$ and $\pi 2$, are relayed to a transmitter 44 and transmitted.

Figure 5:
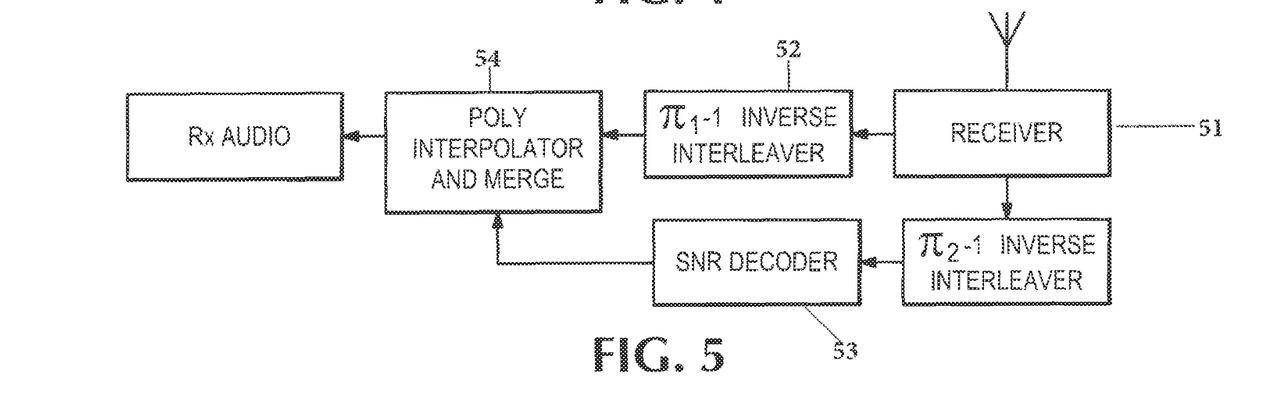
FIG. 5 is a block diagram of the steps preparing a signal following reception.

As shown in FIG. 5, a receiver 51 receives both signals $\pi 1$ and $\pi 2$, however each one or both is likely to have been degraded in transmission or reception, such that portions of the $\pi 1$ or $\pi 2$ are missing or degraded. Because $\pi 1$ and $\pi 2$ have independent interleaving sequences it is unlikely that the degradation will occur in the same time index of both audio waveforms. $\pi 1$ goes through a reverse interleaver 52 illustrated as $\pi 1^{-1}$. $\pi 2$ goes through a SNR decoder 53 illustrated as $\pi 2^{-1}$. The signals $\pi 1$ or $\pi 2$ then undergo a polynomial interpolator and are merged 54. The merged signal is then output. This results in efficient, less "lossy" transmission of a 24-bit audio signal.

The received signal can be inspected, with particular care to determine if portions of $\pi 1$ are missing or damaged. If it is determined that an error occurred, such as due to interpolator error, then the portion where the error occurred can be matched to the degraded version in $\pi 2$ for output.

When using this method for interleaving an audio signal with one interleaving sequence and the audio signal's redundant copy with another independent interleaving sequence, the redundant copy may be reduced in bit depth, sample rate, or use other audio compression methods to limit the amount of redundant data to be transmitted. This reduced data rate redundant signal is then transmitted with the full precision signal at the same or a higher error coding and/or a lower modulation rate from the transmitter to the receiver. At the receiver the two signals are combined using an iterative process of interpolation and redundant SNR reduced sample selection to reconstruct the audio signal using a hierarchy.

The hierarchy involves determining when a full precision sample has been received, and all full precision samples are copied to output. Any missing full precision samples are then interpolated. The interpolated full precision samples are compared to the redundant samples at the same time index and the redundant sample is selected when the interpolated sample is outside the error window of the redundant sample. Otherwise the interpolated sample is selected. Any remaining missing samples, neither full precision nor redundant nor interpolated selected, are then interpolated from the other.

The result is a greater ability to transmit higher quality audio, i.e. 24-bit signal, with less loss and without having to resort to compressed audio formats or loss in speed.

Terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. A method of transmitting and receiving a signal comprising digitally encoded packets, comprising the steps of:
   a. Interleaving elements of a predetermined number of packets of a first signal;
   b. Determining if the first signal should be folded;
   c. Detecting missing or damaged elements of the first signal;
   d. Estimating the values of the missing or damaged elements of the first signal by interpolation using a polynomial curve fit;
   e. Unfolding the first signal;
   f. Encoding a second signal;
   g. Transmitting and decoding the second signal;
   h. Comparing the estimated values of the missing or damage elements of the first signal to the second signal; and
   i. Outputting portions of the second signal.

2. The method of claim 1 further comprising the step of folding the signal.

3. The method of claim 1 wherein the missing or damaged elements are detected using a checksum process.

4. The method of claim 1 wherein the missing or damaged elements are detected using a cyclic redundancy check.

5. A method of transmitting and receiving a signal comprising digitally encoded packets, comprising the steps of:

a. Interleaving the elements of a predetermined number of packets of a first signal;
b. Folding the first signal;
c. Applying a process to detect missing or damages elements of the first signal after it has been transmitted;
d. Applying a polynomial curve to interpolate the values of the missing or damaged elements of the first signal;
e. Unfolding the first signal;
f. Comparing the first signal to a redundant signal; and
g. Substituting portions of the redundant signal for the first signal.

6. A method of preserving the power of a signal in transmission, comprising the steps of:
  a) interleaving the elements of an original signal to be transmitted at a 48 kHz audio rate with radio link at 18 Mbps,
  b) transmitting the signal, interpolating values for missing or damaged elements detected in a checksum process or cyclic redundancy process, and
  c) unfolding the signal; where the unfolded signal has a SINAD greater than 60 dB and a received power level of −80 dBm to −71 dBm;
  d) determining if errors occurred in the interpolation; and
  e) substituting portions of a redundant transmission into the signal.

7. A method for transmitting and receiving an audio signal, comprising the steps of:
  (a) interleaving an audio signal with a first interleaving sequence;
  (b) interleaving a redundant copy of the audio signal with a second interleaving sequence; where the redundant copy of the audio signal has undergone compression;
  (c) transmitting with the audio signal and the redundant copy at an the same or a higher error coding and/or a lower modulation rate;
  (d) receiving the audio signal and the redundant copy; and
  (e) combining the audio signal and the redundant copy using an iterative process; where the iterative process consists of interpolation and redundant SNR reduced sample selection to construct an output, where the output is constructed in steps consisting of:
    i) Any full precision samples are copied to output;
    ii) Any missing full precision samples are interpolated to create interpolated full precision samples;
    iii) An interpolated full precision sample is compared to a time index-matched redundant sample; and
    iv) a selecter copies to output either the time index-matched redundant sample if the interpolated sample is outside an error window of the redundant sample, or the interpolated full precision sample.

8. The method of claim 7, where the compression may be a reduction in bit depth, sample rate, or other audio compression methods which reduce the amount of redundant data to be transmitted.

\* \* \* \* \*

UNITED STATES PATENT AND TRADEMARK OFFICE
CERTIFICATE OF CORRECTION

| | | |
|---|---|---|
| PATENT NO. | : 9,454,968 B2 | Page 1 of 1 |
| APPLICATION NO. | : 14/185681 | |
| DATED | : September 27, 2016 | |
| INVENTOR(S) | : Kenneth A. Boehlke | |

It is certified that error appears in the above-identified patent and that said Letters Patent is hereby corrected as shown below:

In the specification

Column 1, line 61 "... is sent from the transmitter to the receive,..." should be -- is sent from the transmitter to the receiver, --

Column 2, line 59 "...$S_nS_{n+1-k}S_{n+2-2k}S_{n+3-3}^k\ S_{n+k}S_{n+1}S_{n+2-k}S_{n+3-2}^k$..." should be -- $S_nS_{n+1-k}S_{n+2-2k}S_{n+3-3k}\ S_{n+k}S_{n+1}S_{n+2-k}S_{n+3-2k}$ --

Column 3, line 3 "...For signal in this range..." should be -- For a signal in this range --

Column 3, line 20 "...The combine data stream..." should be -- The combined data stream --

Column 3, line 59 "...simply form of interpolation...." should be -- simple form of interpolation --

Column 4, line 37 "...this decision to fold or not fold can is optimally made relatively frequently,..." should be -- this decision to fold or not fold is optimally made relatively frequently, --

In the claims

Claim 1, column 6, line 57 "...damage elements of the first signal..." should be -- damaged elements of the first signal --

Claim 5, column 7, line 4 "...damages elements of the first signal..." should be -- damaged elements of the first signal --

Claim 7, column 8, line 7 "...at an the same or a higher error coding..." should be -- at the same or a higher error coding --

Signed and Sealed this
Fifteenth Day of November, 2016

Michelle K. Lee
*Director of the United States Patent and Trademark Office*